(12) United States Patent
Tyhach et al.

(10) Patent No.: US 11,127,652 B2
(45) Date of Patent: Sep. 21, 2021

(54) SEMICONDUCTOR STRUCTURES HAVING REDUCED THERMALLY INDUCED BOW

(71) Applicant: Raytheon Company, Waltham, MA (US)

(72) Inventors: Matthew C. Tyhach, Wakefield, MA (US); Jarrod Vaillancourt, South Hampton, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/661,272

(22) Filed: Oct. 23, 2019

(65) Prior Publication Data

US 2021/0125893 A1 Apr. 29, 2021

(51) Int. Cl.
| | | |
|---|---|---|
| *H01L 23/373* | (2006.01) | |
| *H01L 27/07* | (2006.01) | |
| *H01L 29/66* | (2006.01) | |
| *H01L 29/778* | (2006.01) | |
| *H01L 23/66* | (2006.01) | |

(52) U.S. Cl.
CPC ...... *H01L 23/3732* (2013.01); *H01L 23/3738* (2013.01); *H01L 23/66* (2013.01); *H01L 27/0727* (2013.01); *H01L 29/66462* (2013.01); *H01L 29/7786* (2013.01); *H01L 2223/6627* (2013.01); *H01L 2223/6672* (2013.01); *H01L 2223/6683* (2013.01)

(58) Field of Classification Search
CPC . H01L 23/3732; H01L 23/3738; H01L 23/66; H01L 27/0727; H01L 29/66462; H01L 29/7786
See application file for complete search history.

(56) References Cited

U.S. PATENT DOCUMENTS

| | | | | | |
|---|---|---|---|---|---|
| 3,397,447 | A | * | 8/1968 | Hood | H01L 27/00 438/381 |
| 4,418,470 | A | * | 12/1983 | Naster | H01L 21/764 257/352 |
| 5,689,138 | A | * | 11/1997 | Dekker | H01L 27/08 257/275 |
| 5,821,825 | A | * | 10/1998 | Kobayashi | H03B 5/1852 331/66 |
| 2003/0022395 | A1 | | 1/2003 | Olds | |
| 2005/0067716 | A1 | * | 3/2005 | Mishra | H05K 1/0206 257/778 |

(Continued)

OTHER PUBLICATIONS

J. Thompson, G. Tepolt, L. Racz, T. Langdo, D. Gauthier, B, Smith, Embedded Package Wafer Bow Elimination Techniques, 2011 Electronic Components and Technology Conference, IEEE, 4 pages, pp. 55-58.

(Continued)

*Primary Examiner* — Peniel M Gumedzoe
(74) *Attorney, Agent, or Firm* — Daly, Crowley, Mofford & Durkee, LLP (57) ABSTRACT

A Monolithic Microwave Integrated Circuit (MMIC) structure having a thermally conductive substrate; a semiconductor layer disposed on a first portion of an upper surface of the substrate; an active mesa-shaped semiconductor device layer disposed on the semiconductor layer; and a passive electrical device disposed directly on a second portion of the upper surface of the substrate.

4 Claims, 13 Drawing Sheets

(56) References Cited

U.S. PATENT DOCUMENTS

2006/0088978 A1    4/2006   Clarke et al.
2006/0226415 A1   10/2006   Nishijima et al.

OTHER PUBLICATIONS

Paulo Ki, Quanzhong Jiang, Wang N. Wang, Duncan W.E. Allsopp, Stress Engineering During the Fabrication of InGaN/GaN Vertical Light Emitting Diodes for Reducing the Quantum Confined Stark Effect, IEEE Transactions on Electron Devices, vol. 63, No. 12, Dec. 2016, pp. 4796-4801, 6 pages.
Nga P. Pham, Maarten Rosmuelen, George Bryce, Deniz S. Tezcan, B. Majeed, Haris Osman, Wafer Bow of substrate transfer process for GaNLED on Si 8 inch, IEEE, 2012, pp. 202-205, 4 pages.
Notification of Transmittal of the International Search Report and the Written Opinion of the ISA dated Nov. 13, 2020 for International Application No. PCT/US2020/048880; 1 Page.
International Search Report dated Nov. 13, 2020 for International Application No. PCT/US2020/048880; 5 Pages.
Written Opinion of the ISA dated Nov. 13, 2020 for International Application No. PCT/US2020/048880; 11 Pages.
M. Tyhach, S. Berstein, P. Saledas, F. Ejeckman, D. Babie, F. Faili, D. Francis, Comparison of GaN on Diamond with GaN on Sic HEMT and MMIC Performance, CS MANTECH, Apr. 23-26, 2012, b Boston, Massachusetts, 4 pages.
Japanese Office Action with English Translation, Application No. P 109131131, dated Jan. 28, 2021, 9 pages.

\* cited by examiner

SEMICONDUCTOR STRUCTURES HAVING REDUCED THERMALLY INDUCED BOW

TECHNICAL FIELD

This disclosure relates generally to semiconductor structure and more particularly to semiconductor structures having reduced thermally induced bow.

BACKGROUND OF THE INVENTION

As is known in the art, when a structure has two mismatched materials that are bonded/grown together, the different material properties such as Coefficient of Thermal Expansion (CTE) causes the structure to bow. This bow leads to difficulty in wafer fabrication, manifesting as reduced performance and yield of semiconductor devices. One such structure used in the fabrication of high power Monolithic Microwave Integrated Circuits (MMICs) uses as a bottom material a high thermal conductivity substrate, such as diamond (having a thermal conductivity in the range of 1000-2000, or silicon carbide (SiC) (having a thermal conductivity in the order of 120 W/(m·K), for example, because of its high degree of thermal conductivity, and a semiconductor material, such as Group III-Nitride, (e.g., Gallium Nitride (GaN) formed on, or bonded to, the entire upper surface of the substrate upon which active devices such as FETs are fabricated as mesa-shaped semiconductor structures that rest on a portion of the GaN material and passive devices, such as matching networks, passive components, such as capacitors and resistors, and interconnecting transmissions lines that also rest on portions of the GaN. However, direct growth of the diamond on the GaN or bonding at high temperatures creates a Coefficient of Thermal Expansion (CTE) CTE-induced free-standing wafer bow >1 mm for a 100 mm wafer. This bow leads to difficulty in wafer fabrication, manifesting as reduced performance and yield of semiconductor devices.

A number of papers and publications have addressed this bow problem including: J. Thompson, G. Tepolt, L. Racz. A. Mueller, T. Langdo, D. Gauthier, B. Smith, Draper Laboratory "Embedded Package Wafer Bow Elimination Techniques", http://ieeexplore.ieee.org/stamp/stamp.jsp?tp=&arnumber=5898491; Paulo Ki, Quanzhong Jiang, Wang N. Wang, and Duncan W. E. Allsopp "Stress Engineering During the Fabrication of InGaN/GaN Vertical Light Emitting Diodes for Reducing the Quantum Confined Stark Effect", http://ieeexplore.ieee.org/document/7728035/; Nga P. Pham, Maarten Rosmeulen, George Bryce, Deniz S. Tezcan, B. Majeed, Haris Osmanv, Imec, Kapeldreef 75, B-3001 Leuven, Belgium "Wafer bow of substrate transfer process for GaNLED on Si 8 inch" http://ieeexplore.ieee.org/stamp/stamp.jsp?arnumber=6507078.

Figure 1:
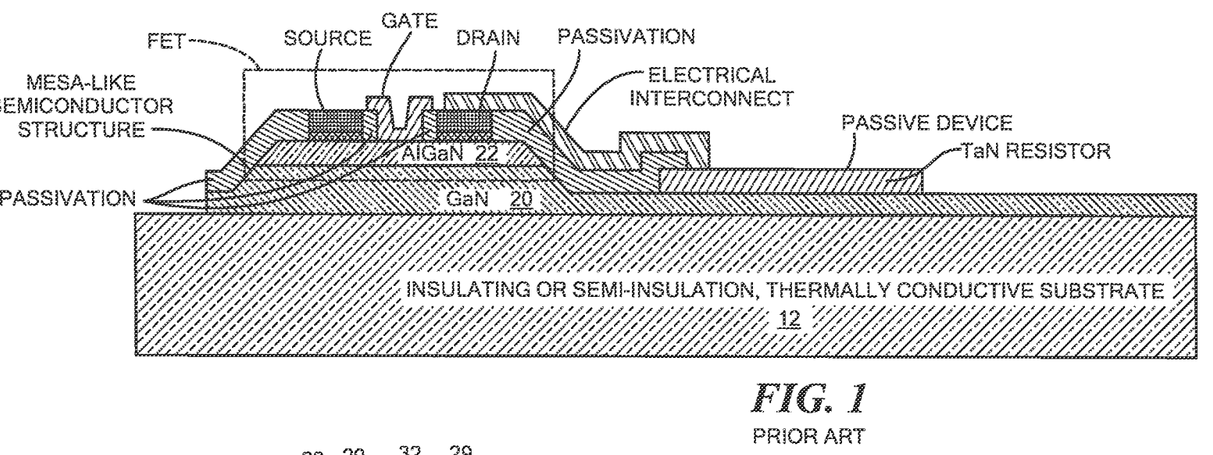
FIG. 1 is a simplified, cross sectional, diagrammatical sketch of a portion of a MMIC having an active device electrically connected to a passive device according to the PRIOR ART.

One such structure using a high thermally conductive substrate for example diamond or Silicon Carbide (SiC) is shown in FIG. 1. An active device, for example, a HEMT FET is formed on one portion of the upper surface of the substrate and a passive device, here for example, a resistor, is formed on another portion of the upper surface of the substrate. The resistor and FET are electrically interconnected by an electrical interconnect. It should be understood that the passive device may by an inductor, a capacitor, for example, and the electrical interconnect may be a power splitter, a power combiner, coupler, such as, for example, a hybrid coupler, a quadrature coupler, a phase shifter, an input matching network, an output matching network, for example. It is noted that a semiconductor layer, here for example Gallium Nitride (GaN) is disposed on the entire upper portion of the high thermally conductive substrate. One portion of the semiconductor layer is a mesa-shaped semiconductor structure providing the active region for the active device, here a FET, while other portions of the semiconductor layer has formed thereon the passive device and portions of the electrical interconnect. A dielectric passivation layer, here for example silicon nitride, is formed over the structure, as shown.

SUMMARY OF THE INVENTION

In accordance with the present disclosure, a Monolithic Microwave Integrated Circuit (MMIC) structure, is provided comprising; a thermally conductive substrate; a semiconductor layer disposed on a first portion of an upper surface of the substrate; an active semiconductor device layer disposed on the semiconductor layer; a passive electrical device disposed directly on a second portion of the upper surface of the substrate. In one embodiment, the active device is a mesa-like structure.

In one embodiment, a semiconductor structure is provided, comprising: a thermally heat conducting substrate; an active device comprising: a mesa structure disposed on an layer on an upper surface of the substrate; and, a passive device disposed on the upper surface of the substrate, a bottom of the passive device being disposed directly on the upper surface of the substrate.

In one embodiment, the semiconductor structure includes an electrical interconnect interconnecting the active device and the passive device, and wherein a bottom surface of the electrical interconnect is disposed directly on the upper surface of the substrate.

In one embodiment, a method is provided for forming a semiconductor structure, comprising: providing a diamond substrate having a Group III-V semiconductor epitaxial layer on, and in direct contact with, an upper surface of the diamond substrate; determining first positions on an upper surface of the diamond substrate for formation of active semiconductor devices and second positions on the upper surface of diamond substrate for formation of passive devices; removing the portions of the Group III-V semiconductor epitaxial layer having the determined second positions to while leaving the Group III-V semiconductor epitaxial layer on the upper surface of the diamond on the determined first positions; and forming active devices directly on the Group III-V semiconductor epitaxial layer at the first determined positions and forming the passive devices directly on the second positions.

In one embodiment, a method is provided for forming a semiconductor structure, comprising: designing a MMIC circuit schematic, such circuit having an active semiconductor device, a passive device, and electrical interconnect connecting the active device to the passive device; from the MMIC designed schematic circuit generate: a mask set, using any convention mask generating software program, for fabricating the designed MMIC circuit, the mask set having: a series of masks for forming active semiconductor devices on active regions of a Group III-V semiconductor epitaxial layer bonded directly to, or formed on, a thermally heat conductive substrate; a second series of masks for forming the passive devices on passive regions directly on, and in direct contact with the substrate outside of the active regions; and a third series of masks for forming electrical interconnects having first end portions on electrical contacts of the active semiconductor devices, second end portions on electrical contact regions of the passive devices and portions of electrical interconnects disposed between the first end portions and the second end portions directly on, and in direct contact with, the substrate outside of the active regions; provide a wafer comprising: the thermally heat conductive substrate; and the Group III-V semiconductor epitaxial layer bonded directly to, or grown on, an upper surface of the thermally heat conductive substrate; using the first series of masks, form semiconductor mesa-like structures where the active devices will be formed on portions of the epitaxial layer; etch away portions of the epitaxial layer outside of the mesa-like structures; form the active semiconductor devices on the mesa-like structures of the Group III-V semiconductor epitaxial layer; using the second series of masks, form the passive devices on passive regions directly on, and in direct contact with the substrate outside of the active regions; and using the third series of mask to form the electrical interconnects having first end portions on electrical contacts of the active semiconductor devices, second end portions on electrical contact regions of the passive devices and portions of electrical interconnects disposed between the first end portions and the second end portions directly on, and in direct contact with, the substrate outside of the active regions and directly on the substrate.

In one embodiment the substrate is diamond or Silicon Carbide (SiC).

The inventors have recognized that, with such an arrangement, early in the wafer fabrication process, once the location of heat generating active devices are identified for formation on the epitaxial layer, for example, GaN/AlGaN the portions on the epitaxial layer for passive devices and electrical interconnects where the epitaxial layer is not required for operation of such passive devices and electrical interconnects may be removed from the upper surface of the substrate. By removing the majority of the GaN/AlGaN surface, and the inventors noting that the majority of the surface is used for the passive devices and electrical interconnects, the diamond or SiC substrate is predominantly left behind. This surface is highly smooth and will support fabrication of monolithic features such as transmission lines and passive devices. Most importantly, a large area of the epitaxy layer is removed, reducing the overall stress and bow of the wafer, reverting to the diamond or SiC substrate characteristics rather than as a composite impacted by the epitaxial layer. Thus, a semiconductor manufacturing process and a composite wafer substrate are provided where a large portion of the epitaxial material from the heat generating active device regions is etched away to thereby support minimal coverage for active device and MMIC operation. Thus, the epitaxial layer is only left remaining in the vital areas; the heat generating active device regions, in order to reduce heating effect causing wafer bow of the overall composite substrate while still providing for a functional MMIC transistor circuits.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Figure 2:
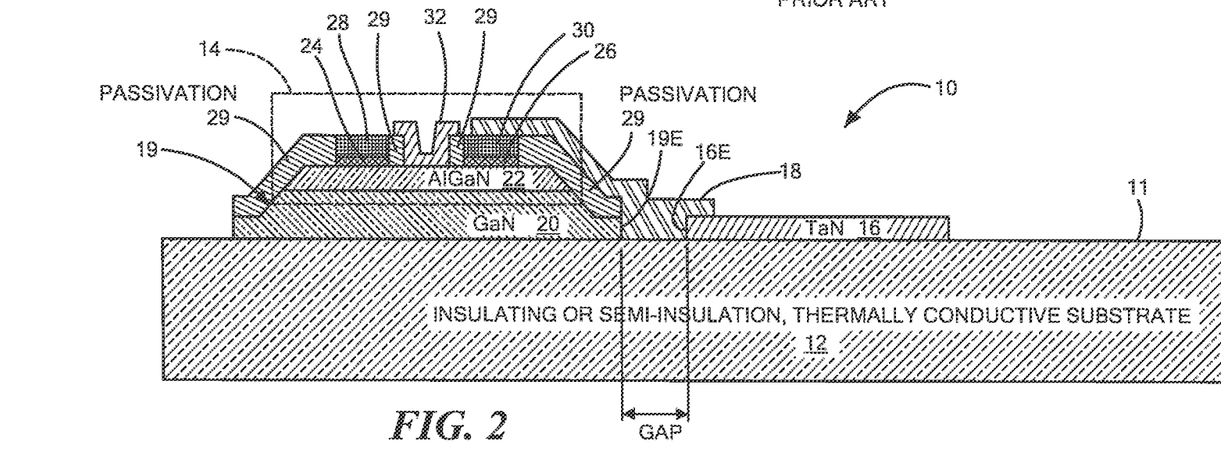
FIG. 2 is a simplified, cross sectional, diagrammatical sketch of a portion of a MMIC of FIG. 6 having an active device electrically connected to a passive device according to the disclosure.

Referring now to FIG. 2, a MMIC 10 is shown formed on a single crystal or crystalline thermally heat conducting substrate 12, here for, example diamond or SiC. The MMIC 10 includes an heat generating, active device, here for example, HEMT FET 14, a passive device 16, here a for example a resistor, the active device 14 and passive device 16 being electrically interconnected by electrical interconnect 18. The HEMT FET 14 in this embodiment, is a mesa-shaped semiconductor structure 19 having a lower epitaxial, Group III-N layer 20, here GaN, on the upper surface 11 of the diamond substrate 12 and an upper epitaxial upper layer 22, here AlGaN on the lower epitaxial upper epitaxial layer 20. The FET 14 has a dielectric passivation layer 29, here for example $SiN_x$ formed on the outer surfaces of the lower epitaxial, Group III-N layer 20 and upper epitaxial upper layer 22, as shown. Source and Drain contacts 24, 26, respectively, are formed in ohmic contact with the epitaxial AlGaN layer 22, as indicated. Source and drain electrodes 28, 30 are formed on the source and drain contacts, respectively, as shown. A gate electrode 32 is formed in Schottky contact with the epitaxial AlGaN layer 22, as shown, to control a flow of carriers between the source contact 24 and the drain contact 26. It is noted that the bottom of passive device 16 is disposed on, and in direct contact with, the upper surface 11 of the substrate 12. It is also noted that there is a gap (GAP) between the edge 19E of the mesa-shaped semiconductor structure 19 and the edge 16E of the passive device 16, as shown. It is also noted that a portion of the bottom of electrical interconnect 18, is disposed on, and in direct contact with, the upper surface 11 of the thermally heat conducting substrate 12.

Figure 3A:
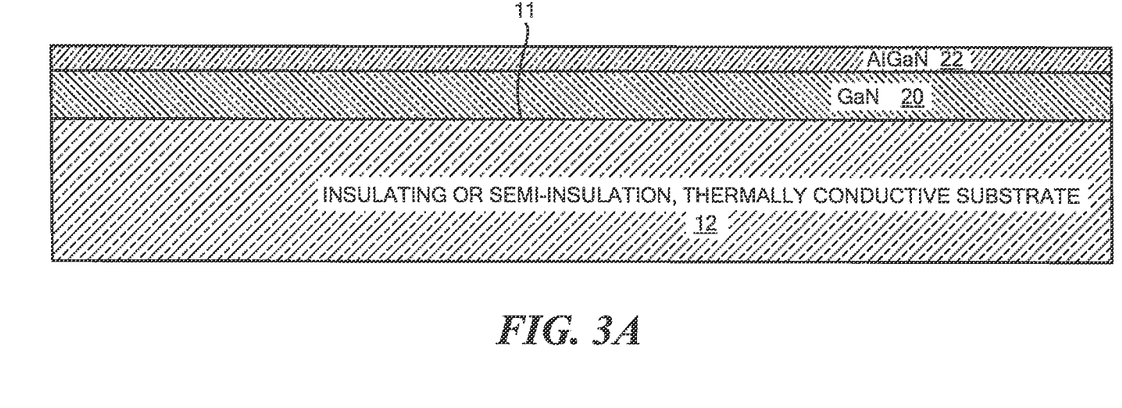
FIGS. 3A-3S are simplified, cross sectional, diagrammatical sketch of a process used to form the MMIC of FIG. 2 at various stages in the fabrication thereof
Figure 3B:
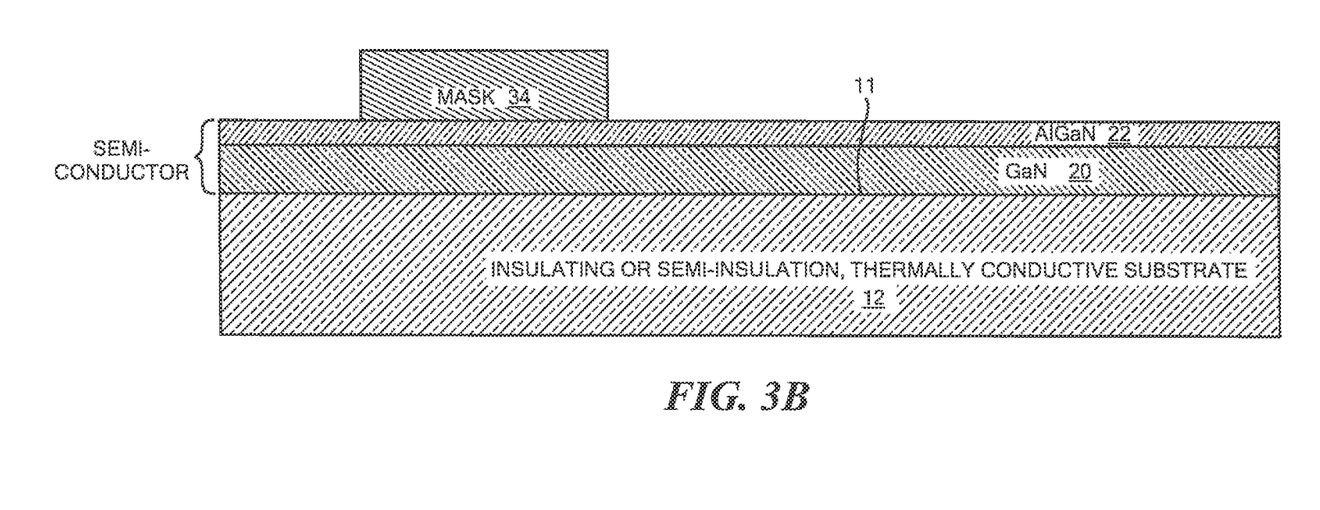
Figure 3C:
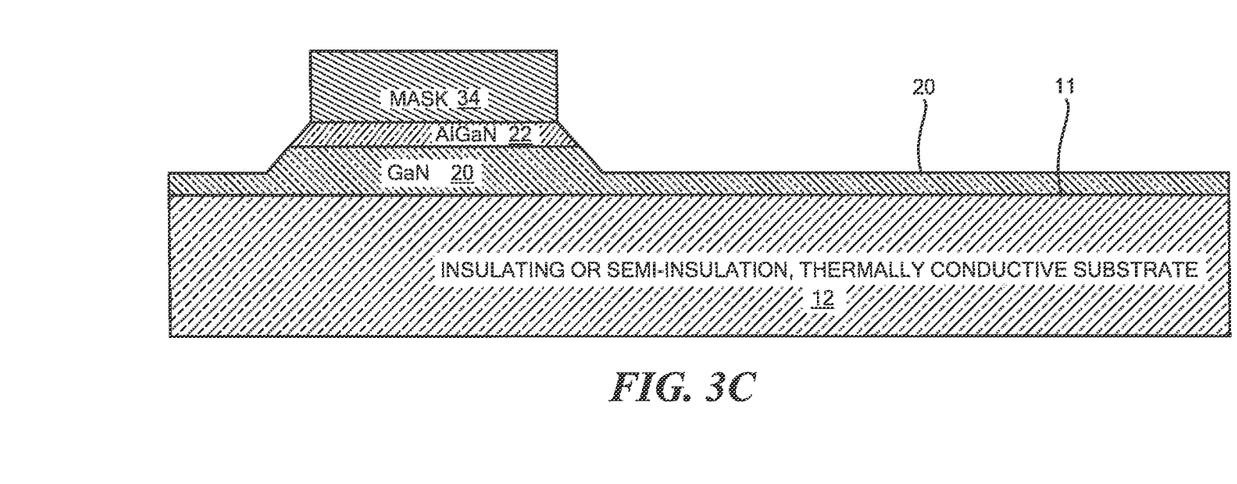
Figure 3D:
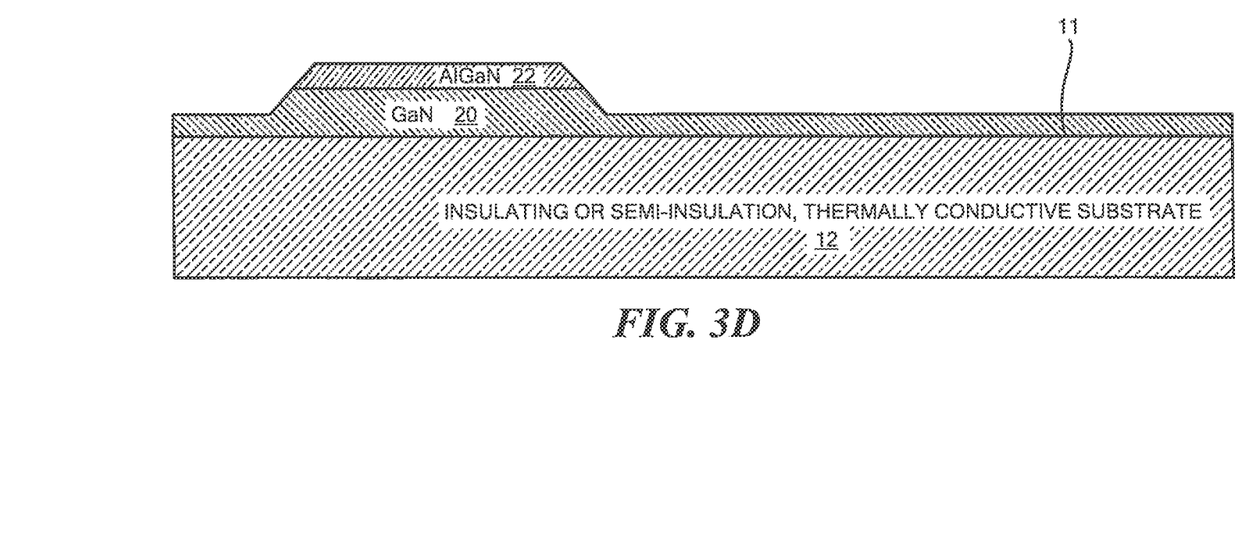
Figure 3E:
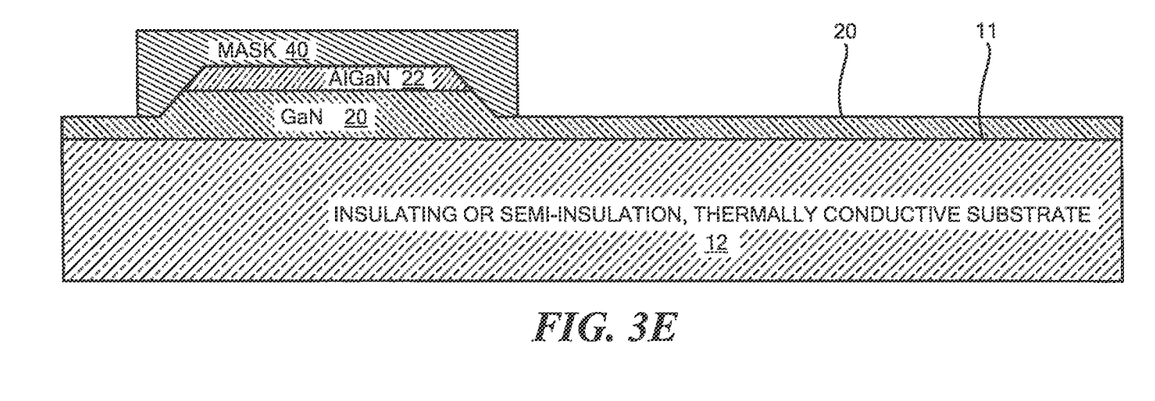
Figure 3F:
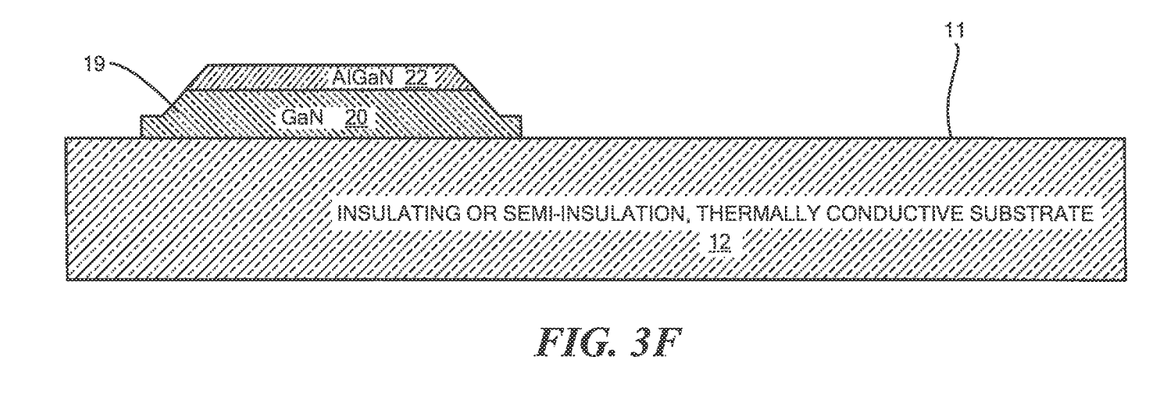
Figure 3G:
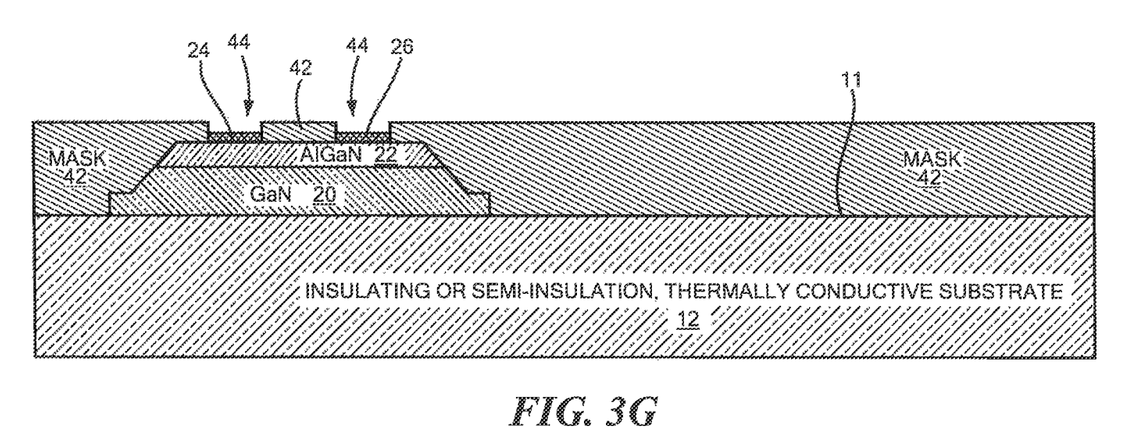
Figure 3H:
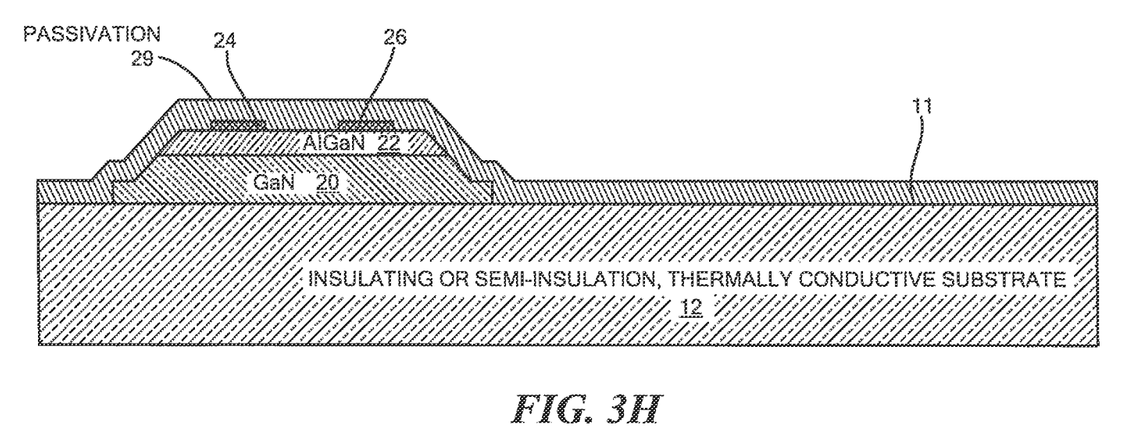
Figure 3I:
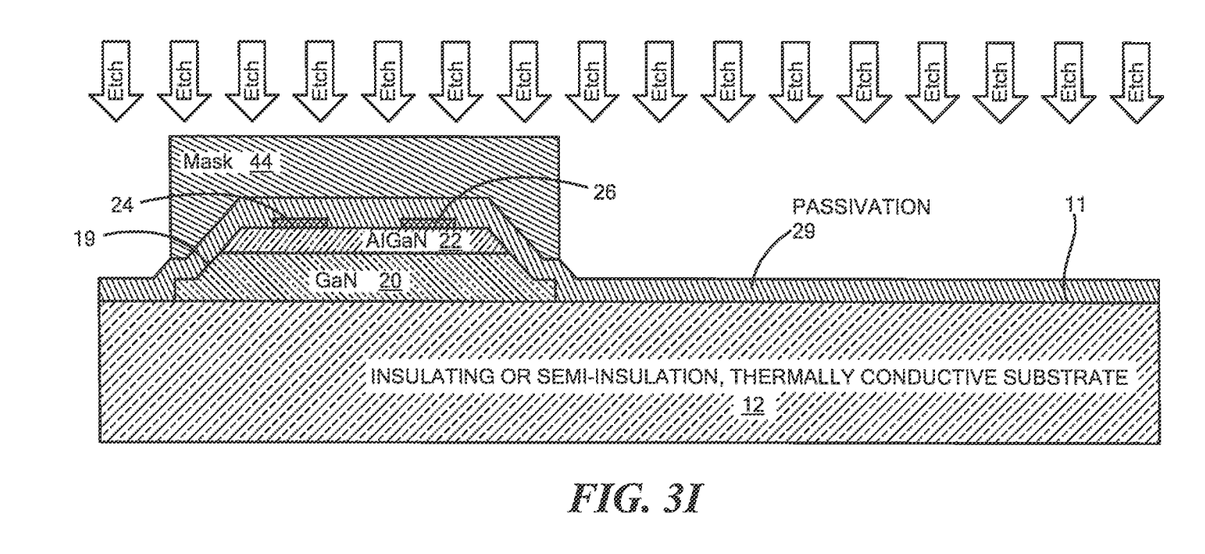
Figure 3J:
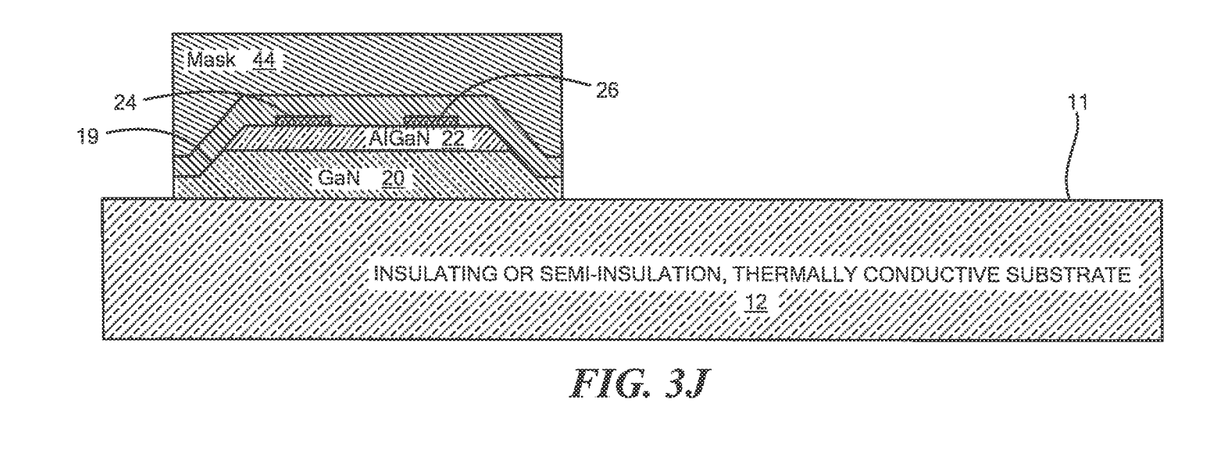
Figure 3K:
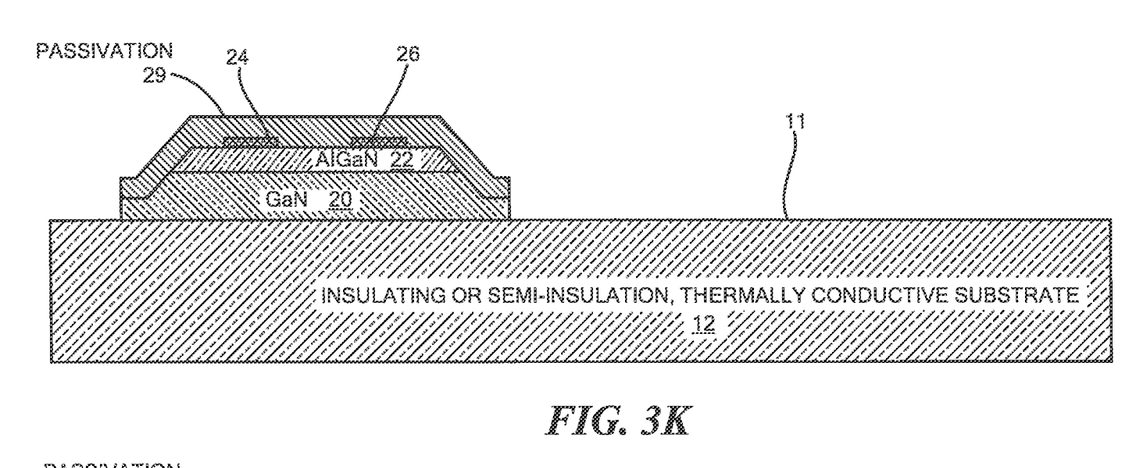
Figure 3L:
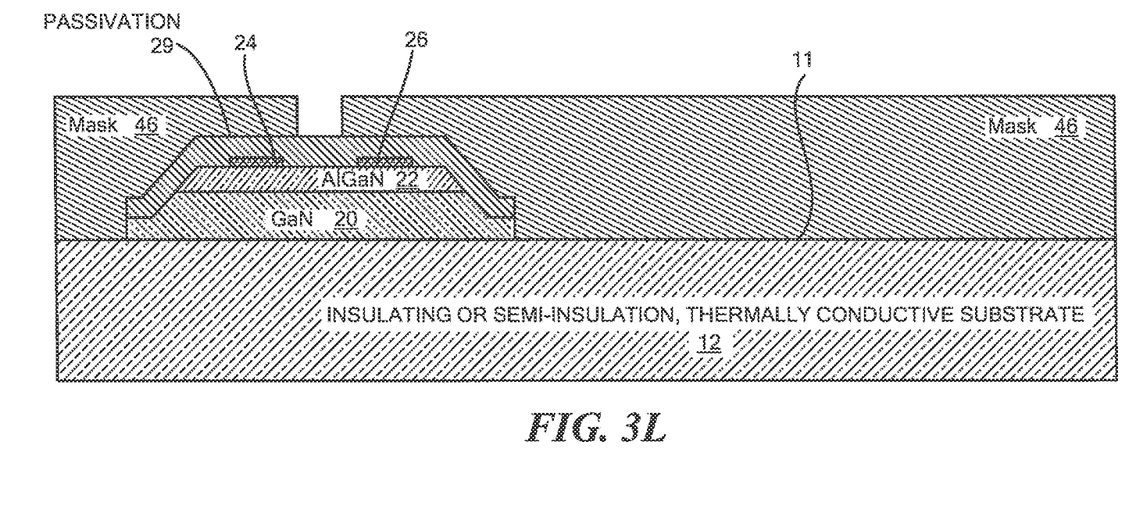
Figure 3M:
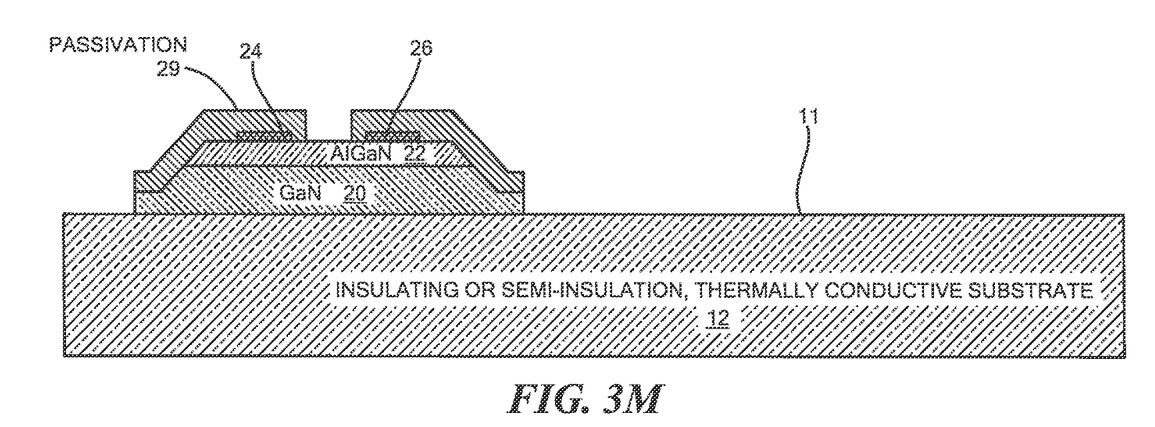
Figure 3N:
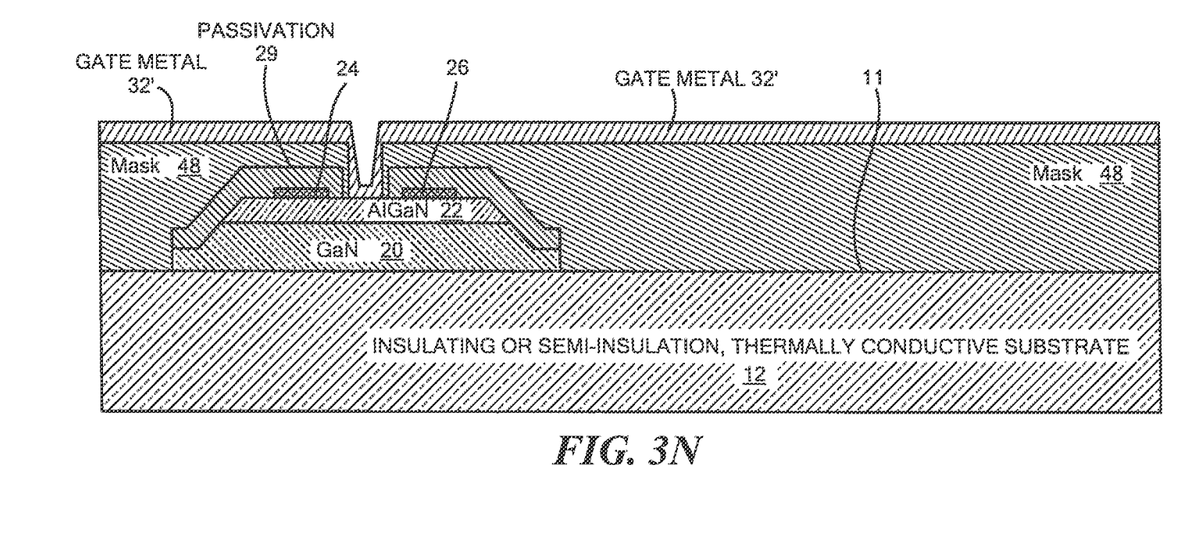
Figure 3O:
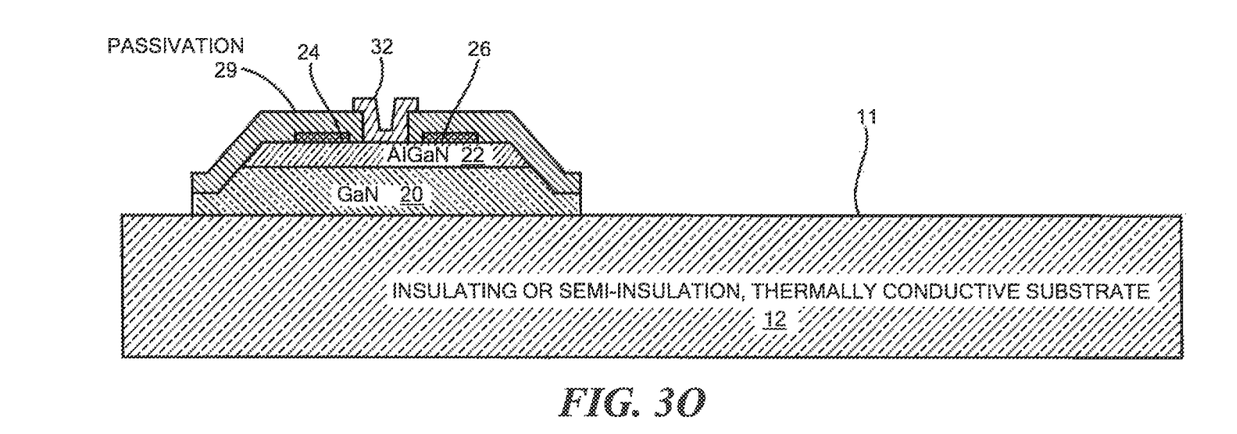
Figure 3P:
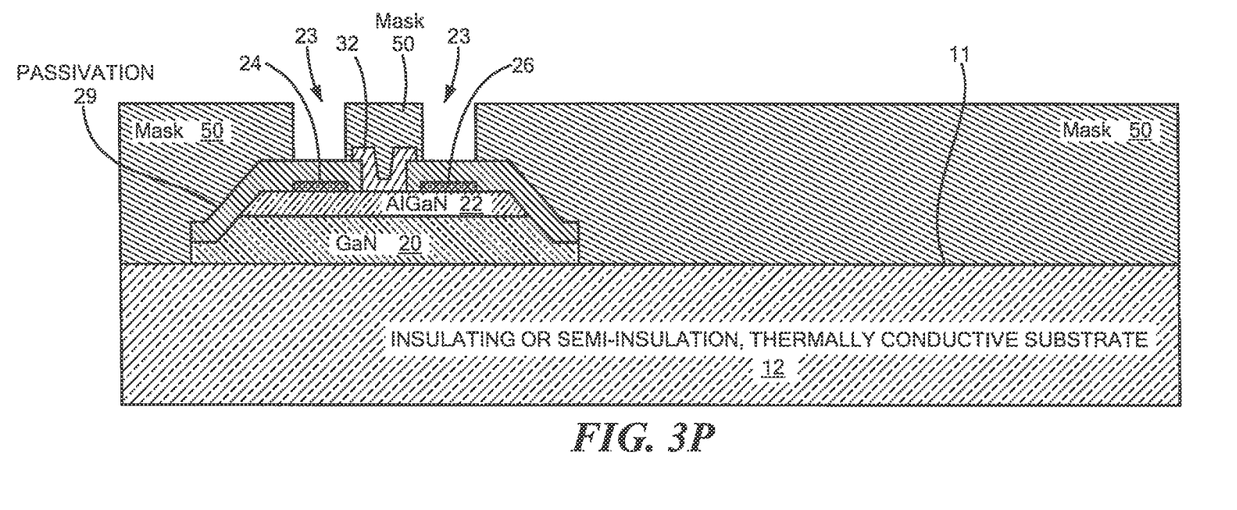
Figure 3Q:
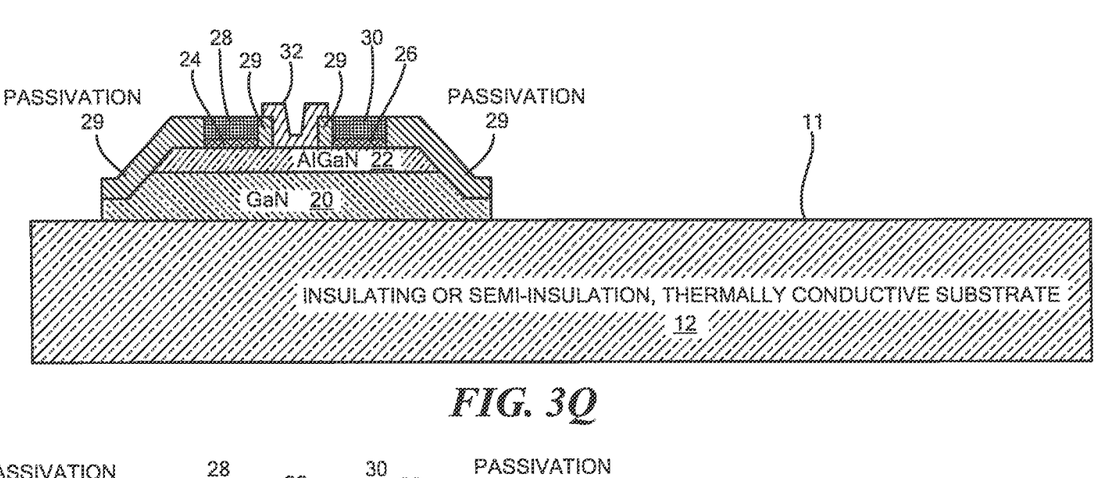
Figure 3R:
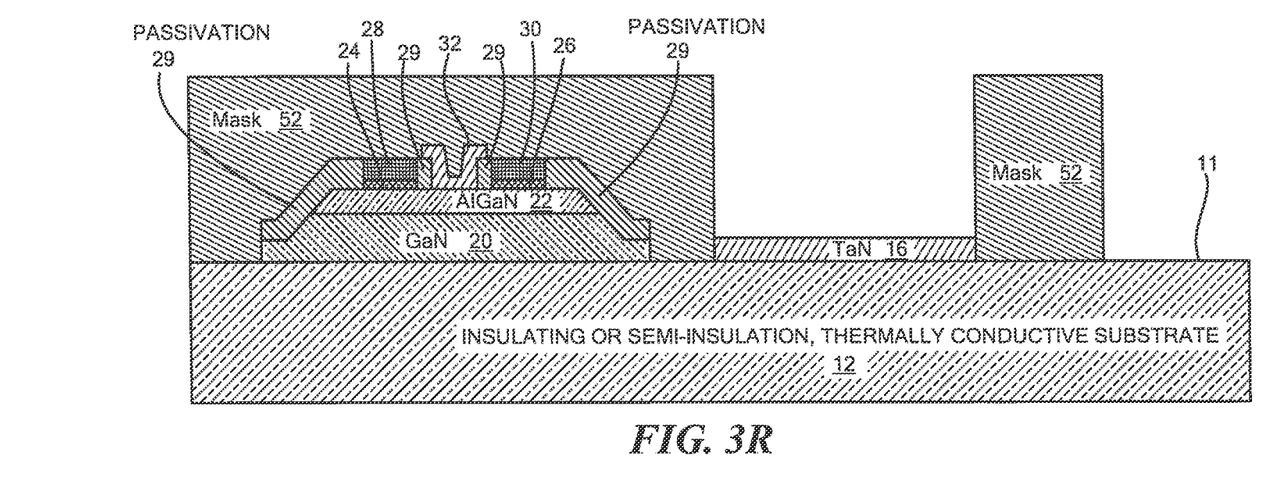
Figure 3S:
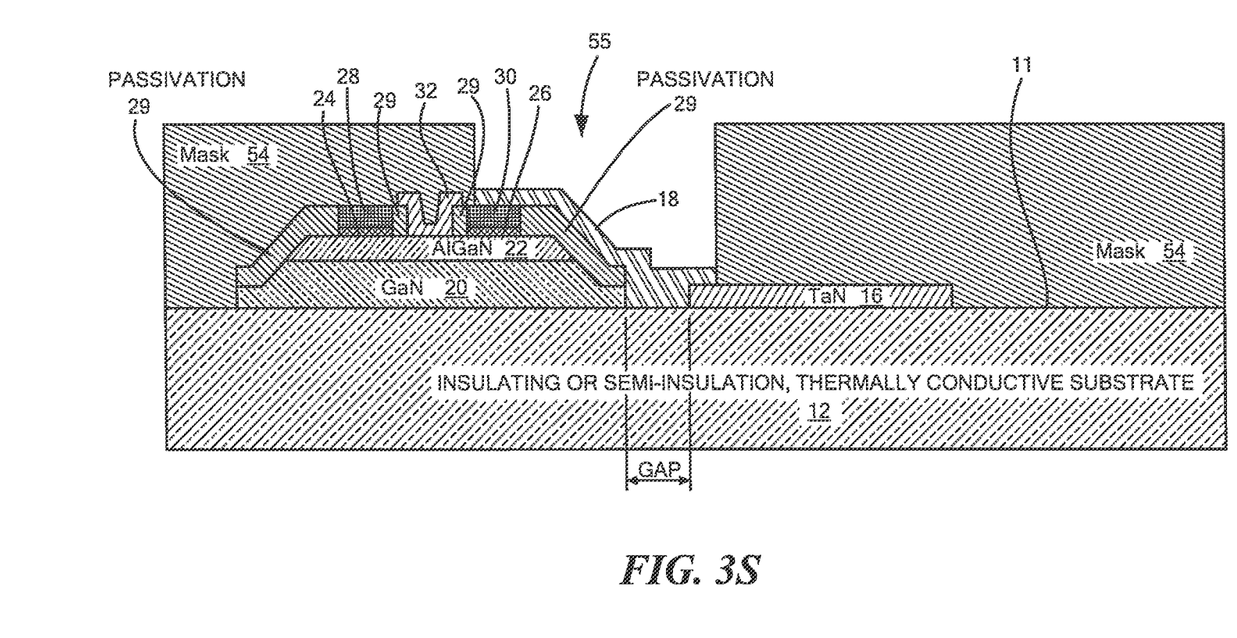

Referring now to FIGS. 3A through 3S, a process is shown for forming the MMIC 10 of FIG. 2 is shown. Thus, after providing the substrate 12, lower semiconductor layer 20 and upper semiconductor layer 22 (FIG. 3A), a mask 34 (FIG. 3B) is formed on a portion of the upper surface of the AlGaN layer 22, such portion being over the surface 11 of the substrate 12 where the mesa-shaped semiconductor structure 19 (FIG. 2) is to be formed. The surface is then exposed to a suitable etchant to remove only upper exposed portions of the lower GaN semiconductor layer 22 and upper portions of the lower semiconductor layer 20, as shown in FIG. 3C. The structure, after the mask 34 is removed, is shown in FIG. 3D; it being noted that the entire upper surface 11 of the substrate 12 is covered with the un-etched portion of the lower GaN layer 20.

Referring now to FIG. 3E, a mask 40 is formed over the portion of the mesa-shaped semiconductor structure 19 where the active device, here FET 14 (FIG. 2) is to be formed. The entire, exposed portions (un-masked portion) of the un-etched portions of lower GaN semiconductor layer 20 are etched away down to the upper surface 11 of substrate 12, as shown. The mask 40 is then removed producing the structure shown in FIG. 3F.

Referring to FIG. 3G, a mask 42 is formed over the structure as shown in FIG. 3G with such mask 42 having windows or openings 44 to expose portions of the upper semiconductor layer 22 of AlGaN for formation of the source and drain ohmic contacts 24, 26, respectively, as shown.

The mask 42 is removed and the surface of the structure is cover with the $SiN_x$ passivation material 29, as shown in FIG. 3H.

Referring to FIG. 3I, a mask 44 is formed on a portion of the deposited passivation material 29, such portion being over the portion of the mesa-shaped semiconductor structure 19 where the active device, here FET 14 (FIG. 2), is to be formed. The entire, exposed portions (un-masked portion) of the passivation (19) are etched away down to the upper surface 11 of substrate 12, as shown in FIG. 3J. It is also noted that the passivation 29 may also be masked, later serving at the layer that passive structures are formed upon.

The mask 44 is then removed leaving the structure shown in FIG. 3K; it being noted that the upper surface of the thermally heat conductive substrate 12 is exposed outside of the portion of the mesa-shaped semiconductor structure 19 where the active device, here FET 14 (FIG. 2) is to be formed.

Referring now to FIG. 3L, a new mask 46 is formed having a window or opening 47 over the portion of the passivation material 29 where the gate contact 32 (FIG. 2) is to be formed Referring now to FIG. 3M, the structure with the mask 46 (FIG. 3L) is exposed to a suitable enchant to expose the portion of the surface of the AlGaN layer 22 where the gate contact 32 is to be formed, as shown in FIG. 3M.

Referring now to FIG. 3N, a mask 48 is deposited over the structure having an opening where a gate metal 32 is to make Schottky contact to the AlGaN layer 22. Next the gate metal 32 is deposited over the mask 48 and through the opening therein onto the portion of the AlGaN layer 22 where the Schottky contact 32 (FIG. 2) is to be made and processed to make such Schottky gate contact 32. The mask 48 is removed, lifted-off, thereby removing the portions of the gate metal 32 thereon and thereby forming the Schottky gate contact 32 as shown in FIG. 3O.

Referring now to FIG. 3P, a mask 50 is formed over the structure having windows or openings 23 over the portion of the passivation material 29 over the source and drain contacts 24, 26, respectively; the portion of the structure where the source and drain electrodes 28, 30, respectively (FIG. 2), are to be formed. Through a similar process as in FIGS. 3M and 3N, the source and drain contacts 24, 26, are exposed and then masked for deposition of source and drain electrode metal.

Referring now to FIG. 3Q, the source and drain electrode metal is deposited through the windows onto the source and drain contacts 24, 26 respectively, as shown, with the mask lifted-off, thereby removing the portions of the metal not utilized for source and drain electrode.

Referring top FIG. 3R, a mask 52 is formed over the structure having a window 53 to expose where the passive device 16 (FIG. 2), here, in this example, a resistor, is to be formed. A resistive material, here for example Tantalum Nitride (TaN) is deposited through the window 53, as shown to form the passive device 16; it being noted that the passive device 16 is shown being formed directly on and in direct contact with the thermally conductive substrate 12. It is also noted that the passive device 16 could also be formed on top of the passivation layer 29 as an alternative to directly on top of substrate 12. It is also noted the there is a gap (GAP) described above in connection with FIG. 2 between an edge of the portion of the mesa-shaped semiconductor structure 19 where the active device, here FET 14 (FIG. 2) is formed and an edge of the passive device.

Referring now to FIG. 3S the mask 52 in FIG. 3R is removed and replaced with a new mask 54 having a window 55 that exposes the drain contact 30 and extends over one end 53 of the passive device 16, as shown. A metal for the electrical interconnect 18 is deposited through the window to thereby connect the drain contact 30 the passive device 16. The mask 54 is then removed producing the MMIC 10 shown in FIG. 2.

Figure 4:
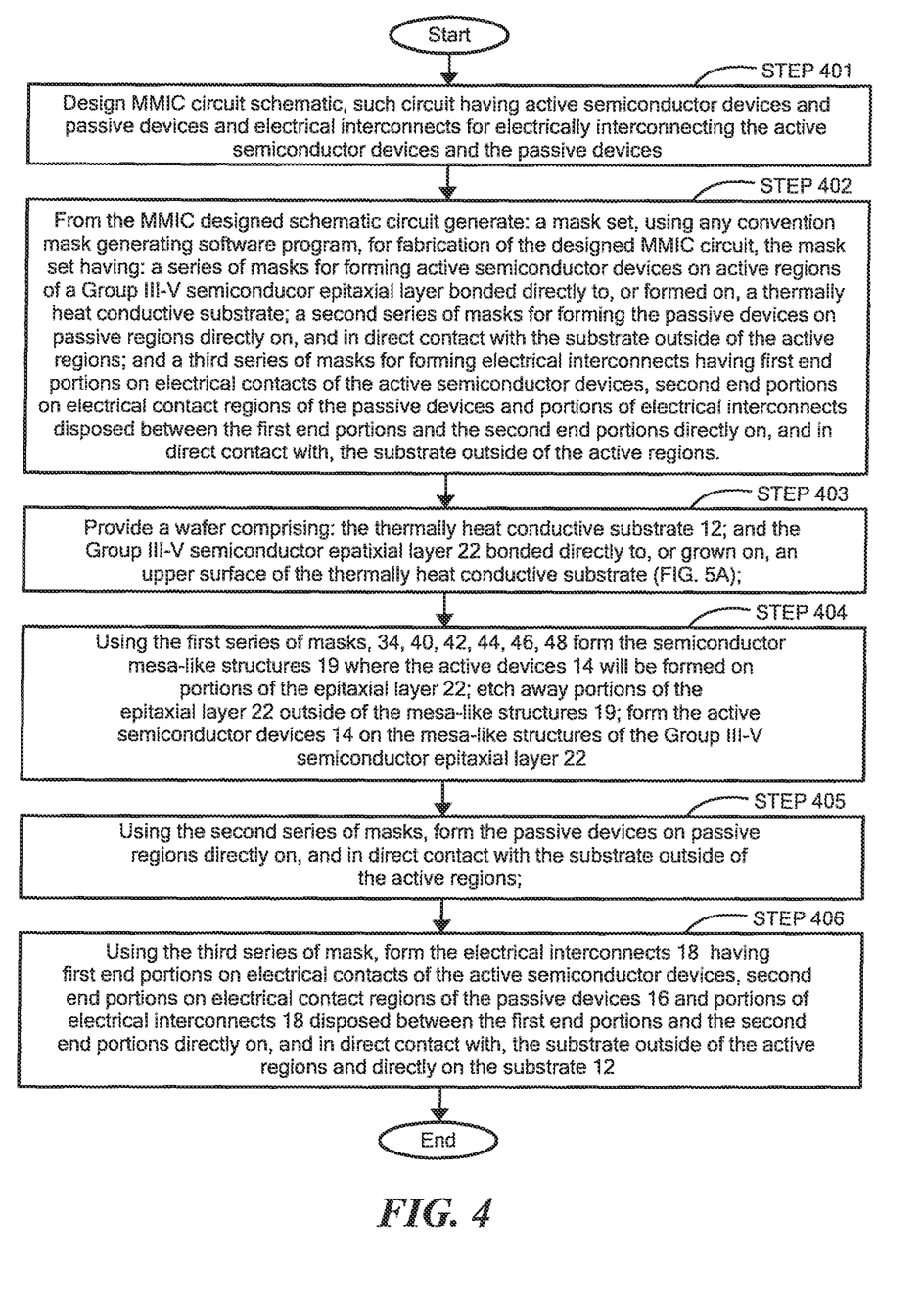
FIG. 4 is a process flow chart showing steps used to fabricate the MMIC of FIG. 2 according to the disclosure.

Referring now to FIG. 4, a simplified flow chart is shown for fabrication an MMIC having the portion shown in FIG. 2 and steps described above in connection with FIGS. 3A-3S. Thus, an MMIC circuit schematic is designed (Step 401), such circuit having active semiconductor devices and passive devices and electrical interconnects for electrically interconnecting the active semiconductor devices and the passive devices. From the MMIC designed schematic circuit generate: a mask set, using any convention mask generating software program, for fabrication of the designed MMIC circuit, the first mask set having: a series of masks for forming active semiconductor devices on active regions of a Group III-V semiconductor epitaxial layer bonded directly to, or formed on, a thermally heat conductive substrate; a second series of masks for forming the passive devices on passive regions directly on, and in direct contact with the substrate outside of the active regions; and a third series of masks for forming electrical interconnects having first end portions on electrical contacts of the active semiconductor devices, second end portions on electrical contact regions of the passive devices and portions of electrical interconnects disposed between the first end portions and the second end portions directly on, and in direct contact with, the substrate outside of the active regions (Step 402). Provide a wafer comprising: the thermally heat conductive substrate 12; and the Group III-V semiconductor epitaxial layer 22 bonded directly to, or grown on, an upper surface of the thermally heat conductive substrate (FIG. 5A) (Step 403). Using the first series of masks, 34, 40, 42, 44, 46, 48 form the semiconductor mesa-like structures 19 where the active devices 14 will be formed on portions of the epitaxial layer 22; etch away portions of the epitaxial layer 22 outside of the mesa-like structures 19; form the active semiconductor devices 14 on the mesa-like structures of the Group III-V semiconductor epitaxial layer 22 (Step 404). Using the second series of masks, form the passive devices on passive regions directly on, and in direct contact with the substrate outside of the active regions (Step 405). Using the third series of mask, form the electrical interconnects 18 having first end portions on electrical contacts of the active semiconductor devices, second end portions on electrical contact regions of the passive devices 16 and portions of electrical interconnects 18 disposed between the first end portions and the second end portions directly on, and in direct contact with, the substrate outside of the active regions and directly on the substrate 12 (Step 406).

Figure 5:
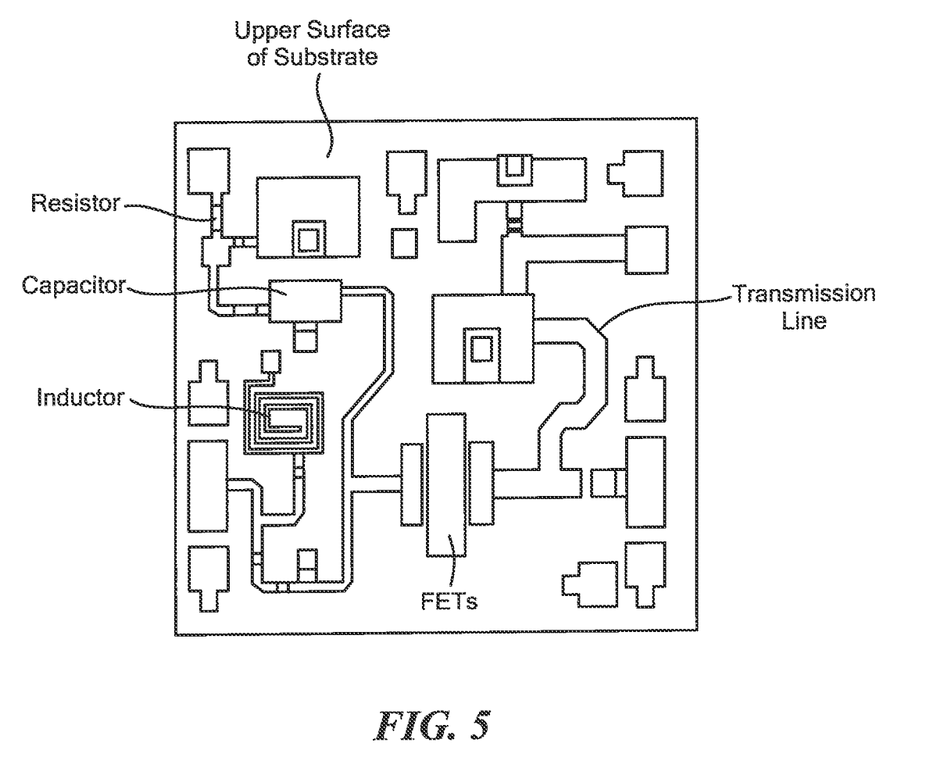
FIG. 5 is a simplified diagrammatical sketch of a top plan view of a chip having formed thereon a MMIC according to the disclosure.

Referring now to FIG. 5 a simplified diagrammatical sketch of a plan view is shown of a chip having formed the MMIC 10. The MMIC 10 includes a plurality of HEMT FETs as shown in FIG. 2, a plurality of the passive devices, here a resistor a capacitor and an inductor and electrical interconnects here microwave transmission lines, such as microstrip or coplanar waveguide (CPW), for example. As noted in FIG. 3, the of HEMT FETs in this embodiment, are mesa structures 18 having a lower epitaxial, Group III-N layer 20, here GaN, located on the upper surface 13 of the diamond substrate 12 and an upper epitaxial upper layer 22, here AlGaN located on the lower epitaxial upper epitaxial layer 20, as described above in connection with FIG. 2. A 2DEG channel 24, indicated by the dotted line, is formed on the upper portion of the lower epitaxial upper epitaxial layer 20. The FET 14a has the dielectric passivation layer 29, here for example $SiN_x$ formed as described above in connection with FIG. 2 and FIGS. 3A-3S. It is observed that the only regions on the upper surface 11 the substrate 12 having the epitaxial Group III-N layers 20, are the mesa structures 19; and more particularly the only regions on the upper surface 11 the substrate 12 are the active devise 14. Thus, the mesas 19 are separated one from another by exposed portions of the upper surface 11 of the substrate 12.

Thus, referring to FIG. 5, it is noted that the FETs occupied by the mesa structure 19 while the much larger portion of the upper surface of the substrate is void of the epitaxial Group III-N layers 20 that is used to form the passive devices and the electrical interconnects.

A number of embodiments of the disclosure have been described. Nevertheless, it will be understood that various modifications may be made without departing from the spirit and scope of the disclosure. For example, the MMC circuit may be different from that shown in FIG. 2. Further, the passive devices may be formed after formation of the active devices. Accordingly, other embodiments are within the scope of the following claims.

What is claimed is:

1. A Monolithic Microwave Integrated Circuit (MMIC) structure, comprising;
    a thermally conductive substrate comprising diamond or SiC;
    an active semiconductor device disposed directly on the thermally conductive substrate, the active a semiconductor device comprises:
        a lower epitaxial semiconductor layer comprising GaN disposed on a first portion of an upper surface of the substrate;
        an upper epitaxial semiconductor layer comprising AlGaN disposed on the lower epitaxial semiconductor layer; and
        a passivation layer comprising SiNx formed on an outer surface of the lower epitaxial semiconductor layer and an outer surface of the upper epitaxial semiconductor layer;
    a passive electrical device disposed directly on a second portion of the upper surface of the thermally conductive substrate; and
    an electrical interconnect disposed in a gap between an edge of the active semiconductor device and the passive electrical device, the electrical interconnect disposed directly on the thermally conductive substrate.

2. The MIMIC structure recited in claim 1 wherein the active semiconductor device is a mesa-like structure.

3. A semiconductor structure comprising:
    a thermally heat conducting substrate comprising diamond of SiC;
    an active device comprising: a mesa structure disposed on an upper surface of the substrate, the active device comprising:
        a lower epitaxial semiconductor layer comprising GaN disposed on a first portion of an upper surface of the substrate;
        an upper epitaxial semiconductor layer comprising AlGaN disposed on the lower epitaxial semiconductor layer; and
    a passivation layer comprising SiNx formed on an outer surface of the lower epitaxial semiconductor layer and an outer surface of the upper epitaxial semiconductor layer;
    a passive device disposed on the upper surface of the substrate, a bottom of the passive device being disposed directly on the upper surface of the substrate, and
    an electrical interconnect disposed in a gap between an edge of the active device and the passive device, the electrical interconnect disposed directly on the substrate.

4. A semiconductor structure comprising:
    a plurality of active semiconductor devices, a plurality of passive devices, and a plurality of electrical interconnects connecting the active devices to the passive devices;
    each of the active semiconductor devices having active regions of a Group III-N semiconductor epitaxial layer bonded directly to a thermally heat conductive substrate comprising diamond or Silicon Carbide;
    each of the passive devices having passive regions in direct contact with the substrate outside of the active regions; and
    the electrical interconnects having first end portions on electrical contacts of the active semiconductor devices, second end portions on electrical contact regions of the passive devices and portions of electrical interconnects disposed between the first end portions and the second end portions in direct contact with the substrate outside of the active regions.

* * * * *